United States Patent [19]
Chen et al.

[11] Patent Number: 6,033,480
[45] Date of Patent: Mar. 7, 2000

[54] WAFER EDGE DEPOSITION ELIMINATION

[75] Inventors: Aihua Chen, Fremont; Karl A. Littau, Palo Alto; Dashun S. Zhou, Sunnyvale, all of Calif.

[73] Assignee: Applied Materials, Inc., Santa Clara, Calif.

[21] Appl. No.: 08/729,210

[22] Filed: Oct. 15, 1996

Related U.S. Application Data

[63] Continuation-in-part of application No. 08/626,789, Apr. 2, 1996, Pat. No. 5,888,304, and a continuation-in-part of application No. 08/200,079, Feb. 23, 1994, Pat. No. 5,800, 680.

[51] Int. Cl.⁷ .................................................. C23C 16/00
[52] U.S. Cl. .............................................................. 118/715
[58] Field of Search .................................... 118/721, 724, 118/725, 728

[56] References Cited

U.S. PATENT DOCUMENTS

| | | |
|---|---|---|
| 4,209,357 | 6/1980 | Gorin et al. . |
| 4,579,618 | 4/1986 | Celestino et al. . |
| 4,585,920 | 4/1986 | Hoog et al. . |
| 4,872,947 | 10/1989 | Wang et al. . |
| 4,892,753 | 1/1990 | Wang et al. . |
| 5,198,034 | 3/1993 | Deboer et al. . |
| 5,228,501 | 7/1993 | Tepman et al. . |
| 5,231,690 | 7/1993 | Soma et al. . |
| 5,238,499 | 8/1993 | van de Ven et al. . |
| 5,304,248 | 4/1994 | Cheng ...................................... 118/728 |
| 5,326,725 | 7/1994 | Sherstinsky ............................... 437/225 |
| 5,343,938 | 9/1994 | Schmidt ................................... 165/80.2 |
| 5,352,294 | 10/1994 | White ....................................... 118/725 |
| 5,383,971 | 1/1995 | Selbrede ................................... 118/728 |

*Primary Examiner*—Bruce Breneman
*Assistant Examiner*—Erin Fieler
*Attorney, Agent, or Firm*—Thomason, Moser & Patterson

[57] ABSTRACT

This invention provides a method and apparatus for substantially eliminating deposition on the edge of a wafer supported on a pedestal in a processing chamber. Process gas flow onto the wafer surface is inhibited from reaching the wafer edge and backside, by means of a shadow ring placed over the wafer without touching it. Deposition on the edge and backside of the wafer are therefore substantially eliminated. The shadow ring defines a cavity which circumscribes the wafer edge, into which purge gas is flowed. This purge gas flows out from the cavity through the gap between the shadow ring and the upper surface of the wafer. Alignment pins are placed on the wafer supporting surface of the pedestal. These pins have sloping surfaces and are arranged to guide the wafer to a centered position on the pedestal when the wafer is placed on the pedestal. These pins also serve to align the shadow ring to the pedestal and thence to the wafer. The shadow ring has a plurality of keyed formations which mate to the pins, and as the shadow ring and pedestal are brought together, the pins serve to align the shadow ring. This precise rotational alignment and centering of the shadow ring results in substantial elimination of edge deposition. The keyed formations have elliptical cross-sections to provide for radial movement of the pins with respect to the keyed formations due to thermal expansion.

14 Claims, 5 Drawing Sheets

WAFER EDGE DEPOSITION ELIMINATION

CROSS-REFERENCE TO RELATED APPLICATIONS

This application is a continuation in part of U.S. patent application Ser. No. 08/626,789 filed on Apr. 2, 1996 now U.S. Pat. No. 5,888,304, and titled "Heater with Shadow Ring and Purge Above Wafer Surface," and of U.S. patent application Ser. No. 08/200,079 filed on Feb. 23, 1994 now U.S. Pat. No. 5,800,080, and titled "Chemical Vapor Deposition Chamber with Substrate Edge Protection," the disclosures of which are hereby incorporated by reference.

BACKGROUND OF THE INVENTION

1. FIELD OF THE INVENTION

This invention relates to a method and apparatus for depositing useful layers of materials on substrates, for example, semiconductor wafers, used in the manufacture of semiconductor dies. More particularly, this invention relates to a method and apparatus for substantially eliminating unwanted deposition on the edge of the wafer.

2. BACKGROUND

Overview of Chemical Vapor Deposition

Chemical vapor deposition, commonly referred to as "CVD," is one of a number of processes used to deposit thin layers of material on a semiconductor wafer, and may be based on thermal, plasma, or optically assisted decomposition, or reaction of chemicals. To process wafers in, for example, a thermal CVD process, a chamber is provided with a susceptor configured to receive a wafer. The wafer is typically placed onto and removed from the susceptor by a robot blade and supported by the susceptor during processing. In these typical systems, the susceptor and the wafer are heated to a temperature of between 200–650° C. prior to processing. Once the wafer is heated to an appropriate temperature, a processing fluid, typically a gas, is introduced into the chamber through a gas manifold often situated above the wafer. The processing gas thermally decomposes upon contact with the heated wafer surface to deposit a thin material layer thereon.

A primary goal of wafer processing is to obtain as many useful die as possible from each wafer. Many factors affect the ultimate yield of die from each wafer processed. These factors include processing variables, which affect the uniformity and thickness of the material layer deposited on the wafer, and particulate contaminants that can attach to a wafer and contaminate one or more die. Both of these factors must be controlled in CVD and other processes to maximize the die yield from each wafer.

Particulate Contamination due to Unwanted Deposition Near the Wafer Edge

One of the causes of particulate contaminants in the chamber is improper deposition at the edge of a wafer. Because edge deposition conditions are difficult to control, due in part to the fact that wafer edges are typically chamfered, incomplete or improper deposition can occur around a wafer's edge. This may lead to deposited layers not adhering properly to each other and/or not adhering properly to the wafer.

Figure 1A:
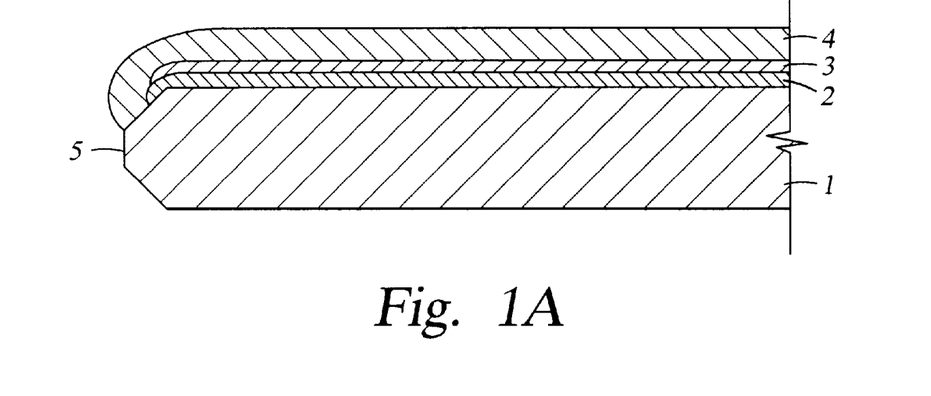
FIG. 1(a) is a partial cross-section of a semiconductor wafer illustrating non-ideal deposition of material layers at the edge of the wafer.

This problem is illustrated in FIG. 1(a), which is a schematic partial cross-section of a typical semiconductor wafer. For this example, the wafer 1 is shown with three consecutive deposited layers 2, 3, and 4 in which the upper layer 4 is a tungsten layer formed after depositing intermediate layers 2 and 3 (or more layers, if necessary) on the wafer. Such a three-layer process for the deposition of tungsten is common as tungsten does not readily adhere to the silicon (or oxidized silicon) surface of the wafer. Accordingly, the very thin "primer" layer 2 is deposited, followed by the second layer 3 of a material to which tungsten layer 4 readily adheres. As can be seen from FIG. 1(a), however, the tungsten layer 4 has "wrapped" around onto the beveled outer edge 5 of the wafer to come into direct contact with the silicon wafer.

The problem with this wrap around, as described above, is that tungsten does not adhere to the silicon wafer surface and could readily chip and flake during handling of the wafer, resulting in particulate contaminants.

Figure 1B:
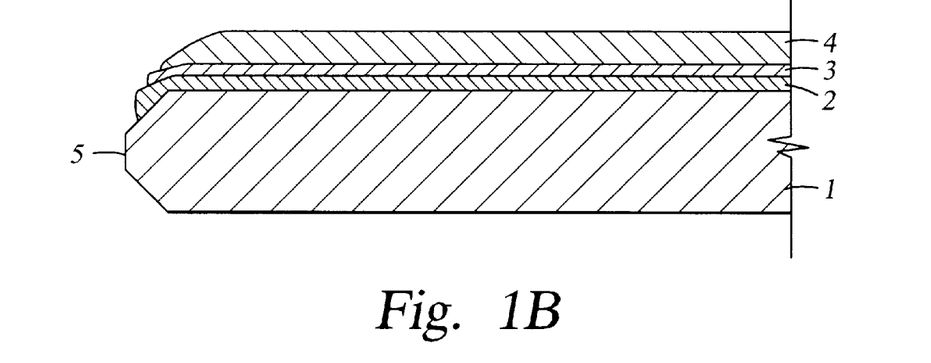
FIGS. 1(b) and 1(c) are partial cross-sections of a semiconductor wafer illustrating improved deposition of material layers at the edge of the wafer.

In contrast, FIG. 1(b) illustrates an idealized edge cross-section, in which all three layers terminate at or close to the same point with respect to the wafer's edge, preferably above the chamfer, with the metal layer 4 being the furthest back from the edge of the wafer.

Unwanted Deposition Near the Wafer Edge due to Heating

A factor which affects the uniformity of the deposition material layer is the method used for heating the wafer. One method involves heating the wafer with infrared lamps through quartz walls of a reaction chamber. If the heat distribution is non-uniform, the wafer may warp, leading to non-uniform deposition on the top of the wafer as well as unwanted deposition from process gas seeping under upraised portions of the edge of the wafer.

Another method for heating the wafer is to use a heater pedestal for both supporting and heating the wafer. An example of this arrangement is described in the co-pending U.S. patent application Ser. No. 08/200,862 filed on Feb. 23, 1994 and titled "Improved Chemical Vapor Deposition Chamber," the disclosure of which is hereby incorporated by reference. In this arrangement, the wafer is supported on a flat supporting surface of a heater pedestal mounted on a vertical stalk within the chamber. The pedestal is heated from within by means of an electrical heating coil, and the wafer, in turn, is heated by the hot supporting pedestal. In order to provide improved uniformity of heating of the wafer, the pedestal embodies of a vacuum chuck in which a "vacuum" is drawn at the interface between the underside of the wafer and the flat supporting surface of the pedestal. The resulting pressure differential across the wafer draws the wafer onto the pedestal resulting in improved uniformity of heating of the wafer. But as a result of this vacuum drawn at the backside of the wafer, processing gas can be drawn around the edge of the wafer and into the interface between the wafer and the pedestal. This can result in unwanted edge and backside deposition, leading to the generation of particle contaminants as described earlier. Accordingly, the improved uniformity of heating is accompanied by a possible increase in unwanted edge and backside deposition.

Prior Art

A number of prior art solutions to this problem have been proposed:

1. Purge Gas Ring

One solution to the problem of unwanted edge deposition is to use a purge gas ring which defines a manifold between itself and the heater body. During processing, a purge fluid, such as a gas, is injected through the heater body into the manifold and is projected toward the edge of the wafer at the outlet of the manifold. Consequently, processing gas is inhibited from contacting the extreme edge portion of the wafer. This method theoretically reduces unwanted deposition on the peripheral edge and lower surface of the wafer to produce the deposit pattern shown in FIG. 1(b). In practice, however, the purge gas ring is not as successful as might be desired.

2. Shadow Ring

Figure 1C:
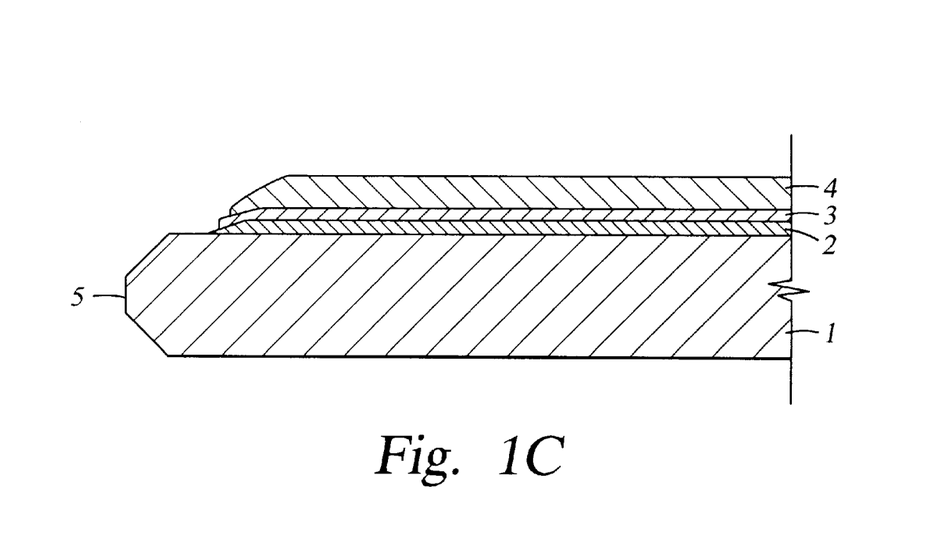

Another solution to this problem is to provide a shadow ring which is located over and in contact with a narrow peripheral area of the wafer to prevent deposition thereon. As shown in FIG. 1(c), use of the shadow ring provides an undeposited annular strip around the wafer edge, which is sometimes desirable from a wafer handling perspective. However, the shadow ring is also not as successful as might be desired because of wafer warpage and the fact that the volatile deposition gas still tends to migrate under the lip of the shadow ring and deposit unwanted material on the wafer edge and backside. Furthermore, any misalignment of the shadow ring with respect to the wafer may result in incomplete shadowing of the wafer edge.

The need therefore exists for a method and apparatus for controlling the deposition of materials at or around the edge of a semiconductor wafer during CVD and/or other wafer processing operations.

SUMMARY OF THE INVENTION

This invention provides a method and apparatus for masking the edge of a wafer supported on a substrate support, such as a heater pedestal, in a processing chamber. Process fluid, such as a gas, is flowed onto the wafer surface, and is inhibited from depositing near the wafer edge by a shadow ring placed over but not in contact with the wafer. The shadow ring defines a wafer edge circumscribing cavity into which purge gas is flowed. This purge gas flows out from the cavity through the gap between the shadow ring and the upper surface of the wafer.

Thus, the shadow ring inhibits deposition of process gases on the wafer in two distinct ways. First, the shadow ring physically obstructs process gas, flowing down from above the wafer, from depositing on the masked portion of the wafer. Second, the shadow ring is used to direct purge gas flow to inhibit process gas from seeping under the shadow ring and depositing near the wafer edge.

Six alignment pins are pressed into and protrude from the wafer supporting surface of the heater pedestal. These pins have sloping surfaces and are arranged so that they guide the wafer to a centered position on the heater pedestal when the wafer is placed on the pedestal. These pins are preferably made from a material which minimizes friction between the pins and the wafer, so that the wafer slides easily into position.

In a preferred embodiment, the pins are made from stainless steel, while the pedestal ais made from aluminum.

These pins also serve to align the shadow ring to the heater pedestal and thence to the wafer. The shadow ring has formed in its underside a plurality of concave features which mate to the pins. As the shadow ring and heater pedestal are brought together, the pins serve to precisely align the shadow ring. The shadow ring is thereby centered and rotationally aligned with respect to the wafer, so that it exactly covers the desired portion of the wafer. At process temperature, the shadow ring rests on the support ring and there is a small gap between the tops of the pins and the shadow ring. The pins have elliptical cross-sections which are radially aligned with the pedestal to accommodate relative movement between the pins and the concavities due to thermal expansion.

The shadow ring is vertically supported from below (and thus prevented from touching the wafer) by a support ring which circumscribes the heater pedestal. The support ring may be made from aluminum or aluminum alloy, and is welded to the pedestal after aligning it with the pedestal by means of a pin pressed into the pedestal. The interface between the support ring and the pedestal seals the bottom edge of the purge gas manifold defined between the pedestal and the support ring.

The shadow ring typically also has lower thermal conductivity than the heater pedestal, which reduces heat transfer from the heater pedestal to the shadow ring. As the rate of deposition is temperature-dependent, reducing the temperature of the shadow ring reduces deposition thereon. In a preferred embodiment, the heater pedestal is made of aluminum, the support ring is made of 6061-T6 aluminum alloy, and the shadow ring is made of 314 stainless steel or a ceramic.

The heat transfer is further inhibited by minimizing the contact area between the support ring and the shadow ring, which may be accomplished by designing the two rings to have minimal overlap.

This invention finds particular application in, but is not limited to, semiconductor wafer processing chambers which process such wafers using CVD processes.

One advantage of this invention is that it substantially eliminates the occurrence of deposition near the edge of the wafer. This in turn eliminates particle contaminants originating from unwanted near-edge deposition that inadequately adheres to the surface.

Another advantage of this invention is that the aligning pins serve to align the wafer with the pedestal, the shadow ring with the pedestal, and thus, the shadow ring with the wafer. This prevents "off centered" shadowing of the edge portion of the wafer, as well as incomplete shadowing of a non-circular wafer by a non-circular shadow ring that is rotationally misaligned with respect to the wafer.

These advantages and further details of the present invention will become apparent to one skilled in the art from the following detailed description and accompanying drawings.

DETAILED DESCRIPTION OF THE INVENTION

Introduction

Figure 2:
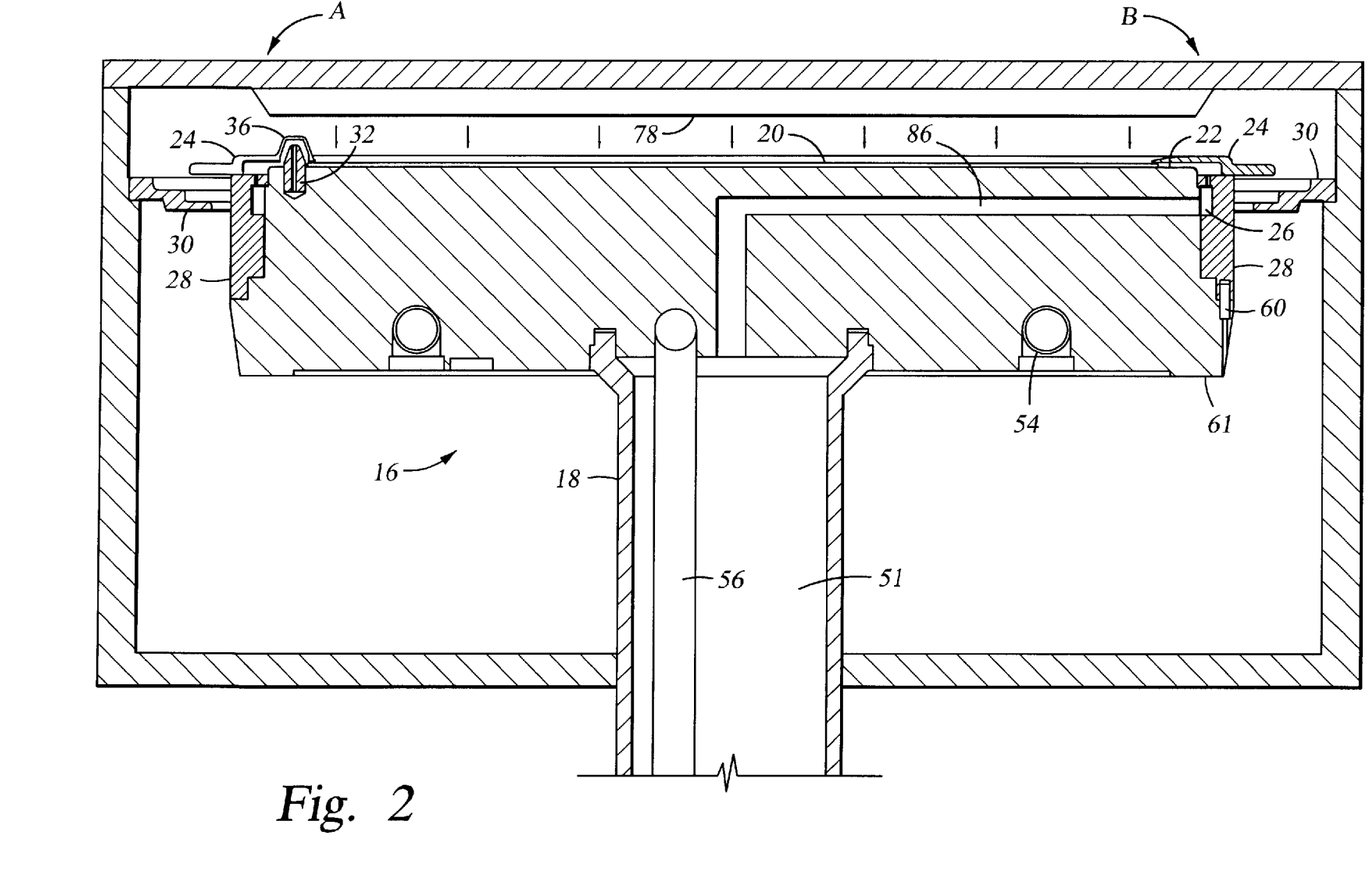
FIG. 2 is an partial sectional view of a heater pedestal in a semiconductor chamber, in accordance with the invention.

A heater pedestal 16 in accordance with the invention is shown in FIG. 2. As will be apparent from the description below, the pedestal 16 can be used to reduce the deposition of material on a semiconductor wafer's underside and edge. The pedestal 16 is shown to include edge protection in the form of a circumferential shadow ring 24 positioned adjacent to the periphery of a wafer 20 received on the supporting surface 22 of the heater pedestal 16.

In operation, a wafer 20 is positioned on the heater pedestal 16 and the shadow ring 24 is positioned to mask an outer peripheral edge of the wafer 20. During processing, a continuous flow of purge gas about the peripheral edge of the wafer is provided through a gap 80 defined between shadow ring 24 and the surface of the masked portion of the wafer 20. This purge flow inhibits deposition on the edge of the wafer 20, and on the underside of the wafer 20 immediately adjacent to its edge.

Detailed Description

1. Pedestal and Shadow Ring Architecture

In FIG. 2, a heater pedestal 16 is shown to comprise a main body 61 supported by a vertical stalk 18. Within the stalk 18 are a purge gas conduit 51, a housing containing a thermocouple (not shown) for measuring the temperature of the pedestal, and a conduit 56 for supplying power to a heating element 54 located within the main body 61 of the pedestal 16. The main body 61, which is typically made from aluminum, has a supporting surface 22 on which a semiconductor wafer can be supported. The surface 22 of the pedestal 16 may have formed therein a plurality of concentric vacuum grooves (not shown) for applying a vacuum to draw the wafer 20 onto the supporting surface 22 for improved uniformity of heating during operation. These vacuum grooves may take the form of concentric grooves and be supplied by a vacuum conduit (not shown) as described in pending U.S. patent application Ser. No. 08/626,789. The surface 22 may be textured to reduce the area of contact between the wafer 20 and the surface 22 to reduce sticking.

Wafer transfers are achieved by means of a conventional processing apparatus robot arm (not shown) which enters the chamber through a slit valve opening (not shown). This robot arm is used to place wafers 20 in position for processing.

A removable shadow ring 24 circumscribes the main body 61 and rests on supporting ring 28, which in turn is electron beam welded to the main body 61 after aligning it by means of a pin 60 embedded in the main body 61. Alternatively, the pin 60 may be embedded in an aluminum ring (not shown) which is welded to main body 61. Supporting ring 28 and main body 61 define a purge gas manifold 26, which would be difficult to machine from a single piece of material. The purge gas manifold 26 is fed by eight purge gas conduits 86 formed in main body 61, and serves to distribute and equalize the pressure/flow of purge gas received from purge gas conduits 86. These purge gas conduits 86 are in communication with a purge gas supply (not shown) via purge gas conduit 51.

Figure 3A:
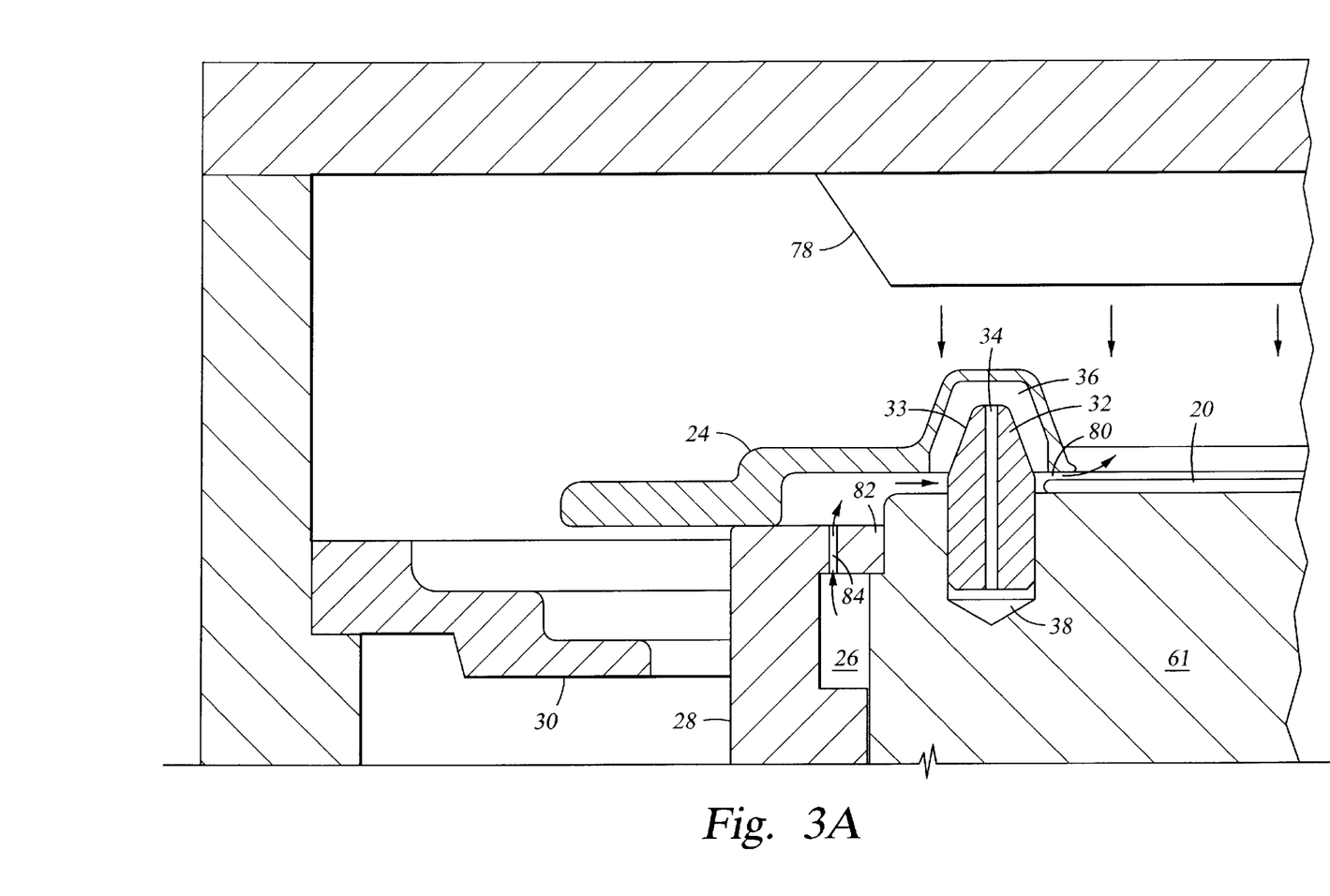
FIGS. 3(a) and 3(b) are detailed views of the upper portions of the heater pedestal shown as regions A and B, respectively, in FIG. 2, illustrating in particular, the configuration of the shadow ring.
Figure 3B:
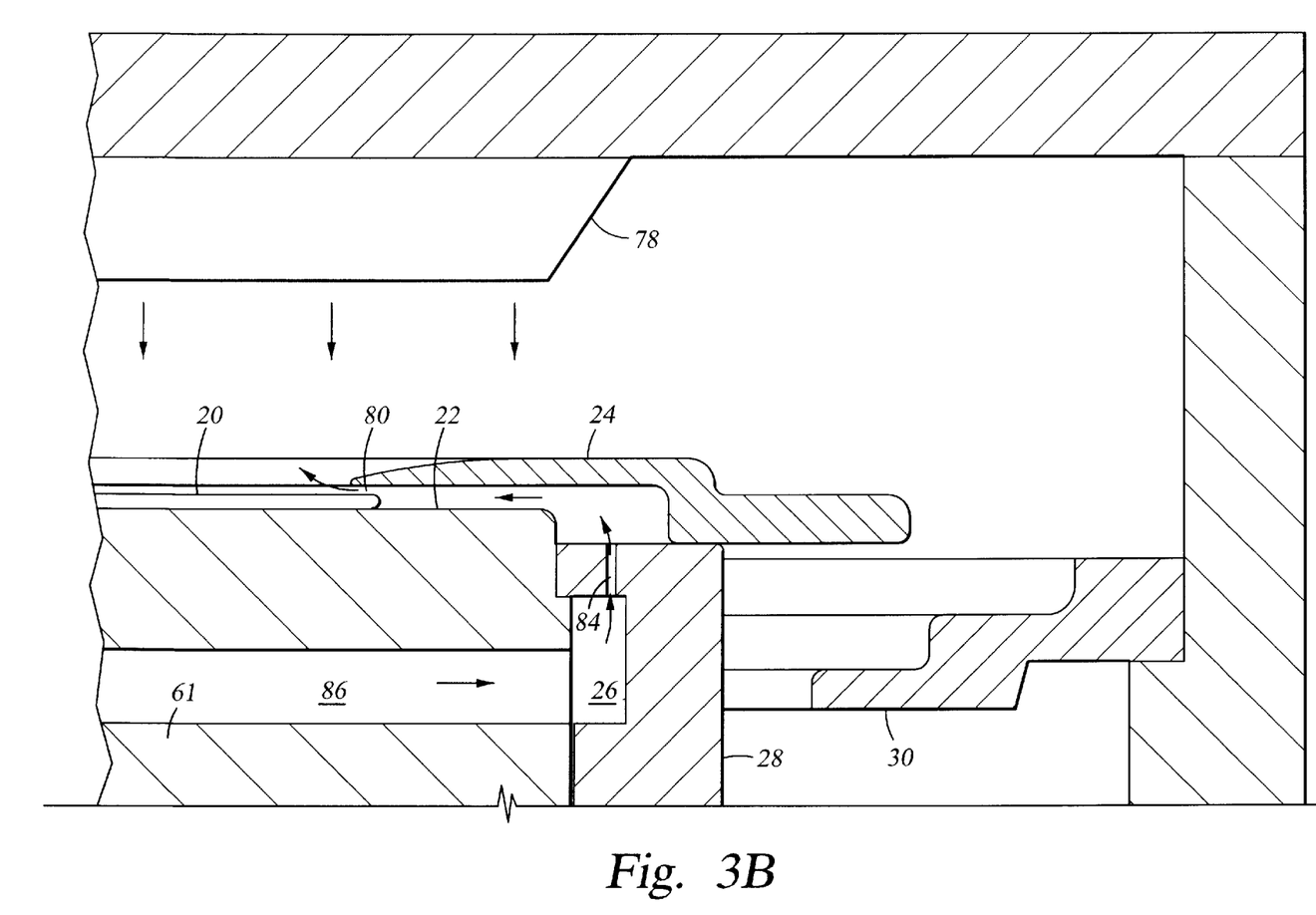

As shown in FIGS. 3(*a*) and 3(*b*), purge gas flows through passage 84 and feeds a purge gap 80 defined between the shadow ring 24 and the upper surface of the masked portion of the wafer 20. The purge gap 80 is dimensioned to allow sufficient flow of purge gas to prevent deposition on the edge and underside of the wafer. In a preferred embodiment of the invention, the purge gap 80 is 0.010 to 0.030 inches (0.25 to 0.76 mm) when the apparatus is at operating temperature (typically 265° C.).

Although the figures illustrate a preferred embodiment suitable for use with a circular wafer, it is noted that the purge gap 80 follows the perimeter of the wafer. Accordingly, if a non-circular wafer (such as a wafer with a "wafer flat" formed in it) is being processed, the purge gap 80 will be formed to follow the irregular perimeter. Furthermore, though the preferred embodiment comprises a supporting surface 22 having a flat surface for supporting the wafer, the invention may be used with supporting surfaces having different configurations, such as a wafer supporting surface having a pocket for the wafer.

2. Wafer and Shadow Ring Alignment

The main body 61 of the pedestal 16 has six alignment pins 32, each of which has sloping sides 33. Each pin 32 is pressed into a hole 38 drilled in main body 61 and protrudes from the surface 22 of the pedestal 16 as indicated in FIG. 3(*a*). The sloping sides 33 of each pin 32 serve to guide the wafer 20 and shadow ring 24 into position when engaged by the pin 32. Each pin 32 has an axial passage 34 which permits residual gas to escape from the region under the pin 32 in the hole 38, so that excess pressure does not build up under the pin 32 and force it out when the chamber is heated to operating temperature. This axial passage 34 can also eliminate "virtual leak," when trapped non-process gases may leak into the process chamber from under the pin 32.

In the preferred embodiment, the pin 32 is 0.187" (4.75 mm) and has a circular cross-section. However, pin 32 may have an elliptical or other non-circular crosssection to, for example, increase the area of contact with the edge of the wafer 20. Further, the pin 32 may be domed or given a sharply angled shape. In the illustrated embodiment, the sloped sides 33 of pin 32 have an angle of approximately 20 degrees from the major axis of the pin 32. In this embodiment, the pin 32 is made from a material, such as stainless steel, which minimizes friction with respect to wafer 20 and shadow ring 24.

The pins 32 are arranged around the surface 22 so that they guide the wafer 20 and shadow ring 24 to a centered position on the heater pedestal 16 when wafer 20 and shadow ring 24 engage the pins 32. As the wafer 20 is placed in position on the pedestal, any misalignment of the wafer 20 causes its edge to come into contact with at least one pin 32, so that the sloped sides 33 cause the wafer to move into an aligned position.

Figure 4:
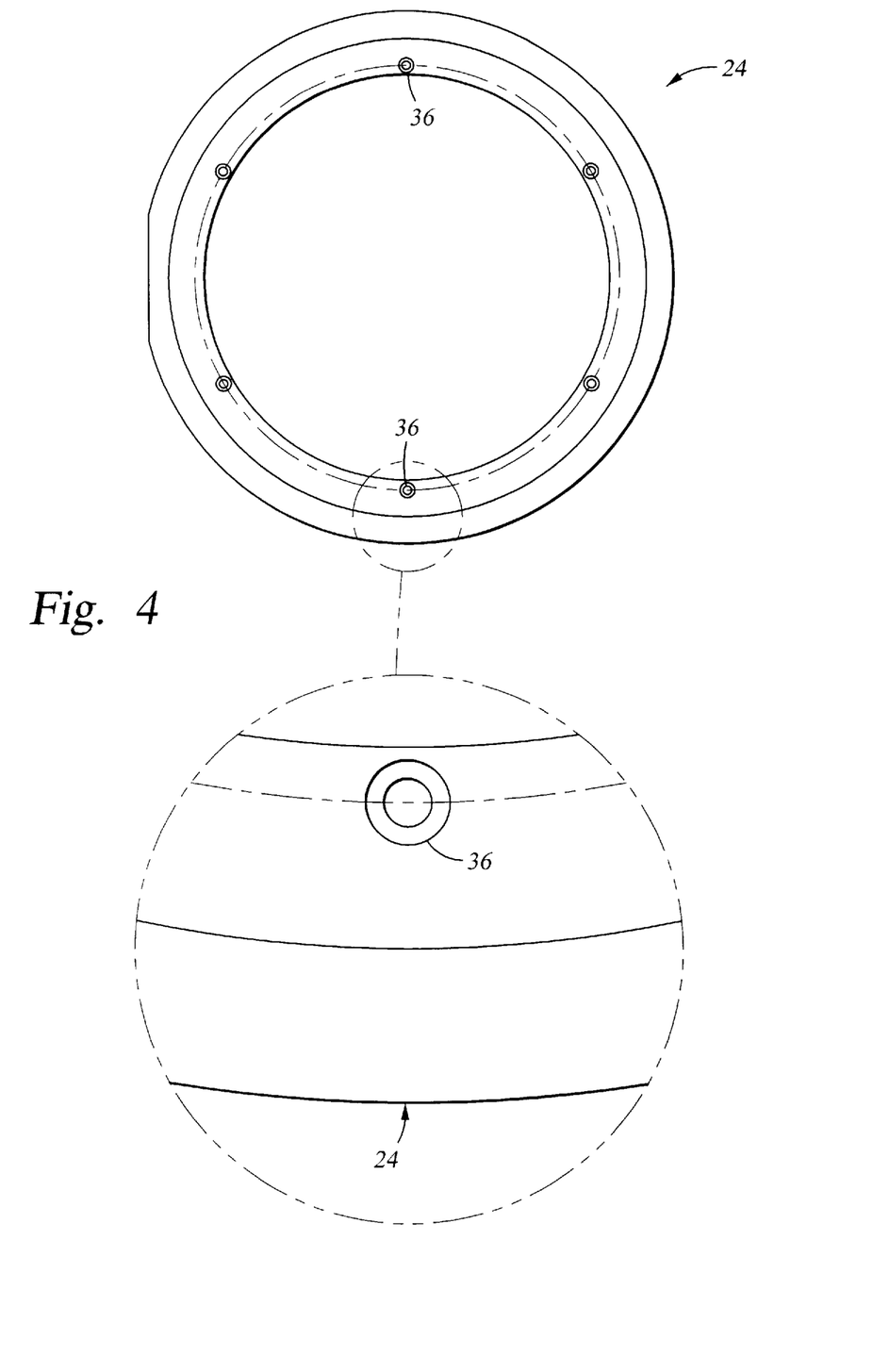
FIG. 4 is a bottom view of the shadow ring of FIGS. 3(a) and 3(b).

These pins 32 are also used to align the shadow ring 24 to main body 61, and thence to the wafer 20. As indicated in FIG. 4, the shadow ring 24 has a plurality of indentations 36 which mate with the pins 32. As the heater pedestal 16 and shadow ring 24 are brought together after positioning the wafer 20 on the pedestal 16, pins 32 engage indentations 36. The indentations 36 may be tapered to correspond to the pins 32, and have circular cross-sections. In a preferred embodiment, the indentations 36 have elliptical crosssections to provide for the differing coefficients of thermal expansion of the shadow ring 24 and heater pedestal 16. Each elliptical cross-section has its major axis radially aligned with respect to the pedestal 16. Thus, the elliptical shape of indentation 36 allows for radial movement of the pin 32 with respect to indentation 36 due to thermal expansion.

Any misalignment of the shadow ring 24 is corrected by the engagement of pins 32 with indentations 36. The shadow ring 24 is thereby centered and rotationally aligned. The pins 32 also limit rotational movement of the shadow ring 24. This improves alignment of shadow ring 24 with the wafer 20, which is particularly advantageous when non-circular wafers are used (such as a circular wafer with a flat side) with matching shadow rings, as it reduces the possibility of a portion of the wafer 20 protruding from under the shadow ring 24 (and thus not being shadowed).

At process temperatures, typically 265° C. in the illustrated embodiment, with accompanying thermal expansion of the various components, the shadow ring 24 rests directly on support ring 28, and there is a small gap of approximately 0.020" between the pin 32 and indentation 36.

3. Heat Transfer Considerations

Contact area minimization and material selection are used to reduce heat transfer from the main body 61 to support ring 28 and shadow ring 24. Reducing the contact area at the interface between support ring 28 and shadow ring 24 reduces the heat transfer across this interface. This, in turn, reduces unwanted deposition on the ring by keeping it relatively cool. Thus, support ring 28 contacts shadow ring 24 over a relatively small peripheral area of the support ring 28. The support ring 28 or shadow ring 24 may further have textured contacting surfaces to reduce the area of contact and thus, heat transfer between them. Similarly, in the area above the purge gas manifold 26, the support ring 28 contacts main body 61 only along a small circumferential flange 82. The support ring 28 is supported from below by main body 61.

Material selection is used to further reduce the heat transfer. Thus, shadow ring 24 is made of a material that has lower coefficients of thermal conductivity and thermal expansivion than the material of the main body 61. In a preferred embodiment, shadow ring 24 is made from a nickel-chromium-iron alloy such as 316L stainless steel. The ring's lower thermal conductivity reduces heat transfer from the main body 61 to the shadow ring 24. Similarly, pins 32 are made from 314 stainless steel, which not only reduces heat transfer to shadow ring 24 but also permits wafer 20 and shadow ring 24 to slide easily along their surfaces.

It should be noted that although the disclosed support ring 28 is made from aluminum or aluminum alloy, the support ring 28 may itself be made from a less thermally conductive material such as stainless steel, and affixed to the main body 61.

Alternatively, the support ring 28 may have a component which is made from a less thermally conductive material for contacting the shadow ring 24 and for exposure to process gases.

4. Wafer Processing

FIG. 2 depicts a wafer positioned on a movable heater pedestal during normal operation, i.e., when the heater pedestal is in its uppermost position, after wafer loading has been accomplished. Although FIG. 2 does not depict the wafer loading process, details of this process may be visualized with the aid of the figure.

At the start of processing, heater pedestal 16 is lowered until the shadow ring 24 is caught by pumping plate 30. As the pedestal is further lowered, wafer lift fingers (not shown) in pedestal 16 hit a vertical stop and remain stationary while the rest of the heater pedestal continues to move downward. Thus, the wafer lift fingers become vertically extended clear of the supporting surface 22. When the heater pedestal 16 reaches its lowest position, a robot blade (not shown) holding an appropriately dimensioned semiconductor wafer 20 enters the chamber through an opening 68 in the chamber wall. As the heater pedestal 16 is raised, the extended wafer lift fingers pick up the wafer 20 from the robot blade and the blade is retracted out of the chamber. As the heater pedestal 16 continues to move upward, past the wafer lift finger stops, the wafer lift fingers retract into the main body 61, lowering the wafer 20 with respect to the surface 22. As the wafer 20 moves toward the surface 22, the alignment pins 32 guide the wafer 20 to a centered position on the pedestal 16. The pedestal 16 continues to rise, and the shadow ring 24 is lifted off pumping plate 30 by the support ring 28, and centered and rotationally aligned by the alignment pins 32. Eventually, the heater pedestal reaches its operating position as shown in FIG. 2. At this point, processing may begin.

A typical CVD metal deposition process has two discrete deposition steps. During the first step, lasting about thirty (30) seconds, the pressure in the chamber is reduced to about 0.6 kPa (4.5 Torr) and a metal deposition gas introduced into the chamber. This step, known as a nucleation step, results in a very thin layer of metal being deposited on the wafer. This thin layer serves as a base layer onto which further layers of metal are deposited.

During the second deposition step, lasting less than 60 seconds and during which most of the metal is deposited, a "vacuum" may be drawn at the interface between the wafer and the supporting surface 22 of the pedestal 16, if the pedestal 16 is provided with vacuum grooves (not shown).

The pedestal 16 is resistively heated by means of the electrically powered heating coil 54 mounted within the body of the pedestal 16. The coil 54 is supplied with electrical power along a rigid, stainless steel connecting stem 56 located within the body of the stalk 18. Although only one coil is shown in this figure, more than one coil could be used or even multiple heating elements which are nested together but powered separately. Alternatively, an infrared heater may be used.

When the pedestal 16 is heated, main body 61 expands radially outward due to increased temperature. The support ring 28, which is made of stainless steel having a lower coefficient of thermal expansion and is at a lower temperature, does not expand as much. The outer face of the main body 61 thus comes into horizontal contact with the protruding inner edge 82 of the support ring 28, creating a mechanical seal at the interface between the support ring 28 and the main body 61. This seal inhibits process gas from seeping between main body 61 and support ring 28. The support ring 28, as mentioned before, is welded to and seals against main body 61 in the area below the purge gas manifold 26.

During the second deposition step, an inert purge gas such as argon is supplied at approximately 4.2 cubic feet per minute (about two liters per second) by a purge gas supply (not shown) through the purge gas manifold 26 and out through purge gap 80, at a pressure and flow rate sufficient to substantially inhibit migration of process gas into purge gap 80. Once the purge gas has flowed out of purge gap 80, it enters the processing chamber to be exhausted through standard exhausts in the chamber (not shown).

The supply of this purge gas has a particularly advantageous effect in that it substantially reduces or eliminates deposition of metal on the edge and outer portion of the underside of the wafer. This is because the purge gas flows out continually and at high mass flow rates through the purge gap 80, effectively diluting deposition gas and preventing its diffusion into the vicinity of the wafer edge. In addition, deposition around the outer portion of the top of the wafer is directly inhibited because the shadow ring physically obstructs the process gas from flowing vertically downward in a direction perpendicular to the masked portion of the wafer. Therefore, deposition in the entire near-edge region is reduced by the combination of the shadow ring and the purge gas.

Although the present invention has been described above in terms of a specific embodiment (that of an apparatus for use in a CVD process), it is anticipated that alterations and modifications to this invention will no doubt become apparent to those skilled in the art. For example, the wafer need not be heated by an electrical element within the heater pedestal, but could be heated by infrared lamps outside a quartz processing chamber. As another example, the shadow ring need not be supported mechanically by the support ring, but could be supported, during processing, by the pins 32, a buoyant lift of the purge gas, or mechanically attached to an upper gas manifold. Additionally, although the invention has been described for use in a thermal CVD chamber, the components herein are equally suited for use in plasma deposition and other wafer processing operations. Also, for plasma deposition, it is preferable for both the shadow ring and support ring to be made from a ceramic. It is therefore intended that the following claims be interpreted as covering all such alterations and modifications as fall within the true spirit and scope of the invention.

What is claimed is:

1. A method for inhibiting a process fluid from contacting a portion of a substrate supported on a substrate support in a processing chamber, comprising:
   (a) aligning the substrate with the substrate support using an aligner;
   (b) providing a mask that is at least partially open to flow of the process fluid in a direction substantially parallel to a masked portion of the substrate and obstructs the process fluid from flowing in a direction substantially perpendicular to the masked portion of the substrate;
   (c) aligning the mask with the substrate support using the aligner; and
   (d) flowing a purge fluid between the masked portion of the substrate and the mask to obstruct the flow of the process fluid above the masked portion of the substrate.

2. The method as recited in claim 1, wherein aligning the substrate with the substrate support occurs as the substrate and the substrate support are brought together.

3. The method as recited in claim 2, wherein the aligner engages a peripheral edge of the substrate to align the substrate with the substrate support.

4. The method as recited in claim 2, wherein the aligner aligns the mask with the substrate support as the mask and substrate support are brought together.

5. The method as recited in claim 4, wherein the aligner is separate from the mask at an operating temperature.

6. The method as recited in claim 1, further comprising separating the mask from the substrate to define a path along which the purge fluid flows.

7. The method as recited in claim 6, wherein separating the mask from the substrate includes supporting the mask to inhibit heat transfer between the substrate support and the mask.

8. The method as recited in claim 7, wherein supporting the mask includes using a mask support that is less thermally conductive than the substrate support.

9. The method as recited in claim 7, wherein supporting the mask to inhibit heat transfer includes reducing a contact area between the mask support and at least one of the mask and the substrate support.

10. The method as recited in claim 1, wherein flowing the purge fluid includes flowing the purge fluid radially inward with respect to the substrate.

11. A method for aligning a mask with a substrate supported on a substrate support in a processing chamber, comprising:
    (a) providing an aligner;
    (b) causing the substrate and the substrate support to come into contact, while using the aligner to align the substrate with the substrate support; and
    (c) causing the substrate support and the mask to come together, while using the aligner to align the mask with the substrate support.

12. The method as recited in claim 11, wherein the aligner engages an edge of the substrate to align the substrate with the substrate support.

13. The method as recited in claim 11, wherein causing the substrate support and the mask to come together, while aligning the mask with the substrate support, defines a purge gap between the mask and the substrate.

14. The method as recited in claim 13, wherein the aligner is separate from the mask at an operating temperature.

* * * * *

UNITED STATES PATENT AND TRADEMARK OFFICE
CERTIFICATE OF CORRECTION

PATENT NO. : 6,033,480
DATED : March 7, 2000
INVENTOR(S) : Chen, et. al.

It is certified that error appears in the above-indentified patent and that said Letters Patent is hereby corrected as shown below:

In column 9, line 13, after " aligner" , please insert " as the substrate and support are moved into proximity" .

In column 9, line 14, before " mask" , please delete " providing a" and insert " aligning a mask with the substrate support using the aligner, wherein the" , and after " mask" please delete " that" .

In column 9, line 18, after " substrate;" , please insert " and" .

In column 9, line 19, after " (c)" , please delete " aligning the mask with the substrate support using the" .

In column 9, line 20, please delete " aligner; and" .

In column 9, line 21, please delete " (d)" .

In column 9, line 24, please delete " The method as recited in claim 1, wherein aligning the" .

In column 9, line 25, please delete " substrate with the substrate support occurs as the substrate" .

UNITED STATES PATENT AND TRADEMARK OFFICE
CERTIFICATE OF CORRECTION

Page 2 of 2

PATENT NO. : 6,033,480
DATED : March 7, 2000
INVENTOR(S) : Chen, et. al.

It is certified that error appears in the above-indentified patent and that said Letters Patent is hereby corrected as shown below:

In column 9, line 26, please delete " and the substrate support are brought together".

In column 9, line 27, after " claim", please delete " 2" and insert " 1".

In column 9, line 30, after " claim", please delete " 2" and insert " 1".

In column 9, line 33, after " are", please delete " brought together" and insert " moved into proximity".

Signed and Sealed this

Twentieth Day of March, 2001

Attest:

NICHOLAS P. GODICI

*Attesting Officer*   *Acting Director of the United States Patent and Trademark Office*